United States Patent
Warren

[11] Patent Number: 5,905,639
[45] Date of Patent: May 18, 1999

[54] THREE-DIMENSIONAL COMPONENT STACKING USING HIGH DENSITY MULTICHIP INTERCONNECT DECALS AND THREE-BOND DAISY-CHAINED WEDGE BONDS

[75] Inventor: Robert W. Warren, Newport Beach, Calif.

[73] Assignee: Raytheon Company, Lexington, Mass.

[21] Appl. No.: 08/939,835

[22] Filed: Sep. 29, 1997

[51] Int. Cl.⁶ .............................. H05K 5/02; H01L 23/12
[52] U.S. Cl. .......................... 361/776; 361/777; 361/783; 361/789; 361/803
[58] Field of Search .................................. 174/52.1, 52.4; 257/723, 724, 671, 685, 672, 686, 676, 684, 690, 700, 777, 780, 782, 783, 784, 786; 361/735, 767, 768, 769, 760, 776, 777, 778, 779, 782, 783, 789, 803, 820; 439/68; 438/617, 125

[56] References Cited

U.S. PATENT DOCUMENTS

| | | | |
|---|---|---|---|
| 5,200,810 | 4/1993 | Wojnarowski et al. | 361/749 |
| 5,473,514 | 12/1995 | Nagano | 257/672 |
| 5,502,289 | 3/1996 | Takiar et al. | 361/789 |
| 5,581,498 | 12/1996 | Ludwig et al. | 257/686 |

FOREIGN PATENT DOCUMENTS

| | | | |
|---|---|---|---|
| 0268260 | 5/1988 | European Pat. Off. | 257/690 |

*Primary Examiner*—Donald Sparks
*Attorney, Agent, or Firm*—Leonard A. Alkov; William C. Schubert; Glenn H. Lenzen, Jr.

[57] ABSTRACT

A three-dimensional circuit structure that interconnects an integrated circuit chip, along with additional active devices and passive components to a substrate by way of a high density multichip interconnect decal disposed on the integrated circuit chip. The three-dimensional circuit structure thus comprises the substrate, an integrated circuit attached to the top of the substrate, and the high density multichip interconnect decal attached to the integrated circuit. One or more passive components and relatively small active devices are attached to the top of the high density multichip interconnect decal. A plurality of three-bond, daisy-chained wedge bonds are used to interconnect the active devices and passive components to the substrate by way of the HDMI decal. Each wedge bond comprises a wire that initiates at an HDMI decal bond pad, an intermediate stitch bond at an integrated circuit bond pad, and terminates at a substrate bond pad.

9 Claims, 1 Drawing Sheet

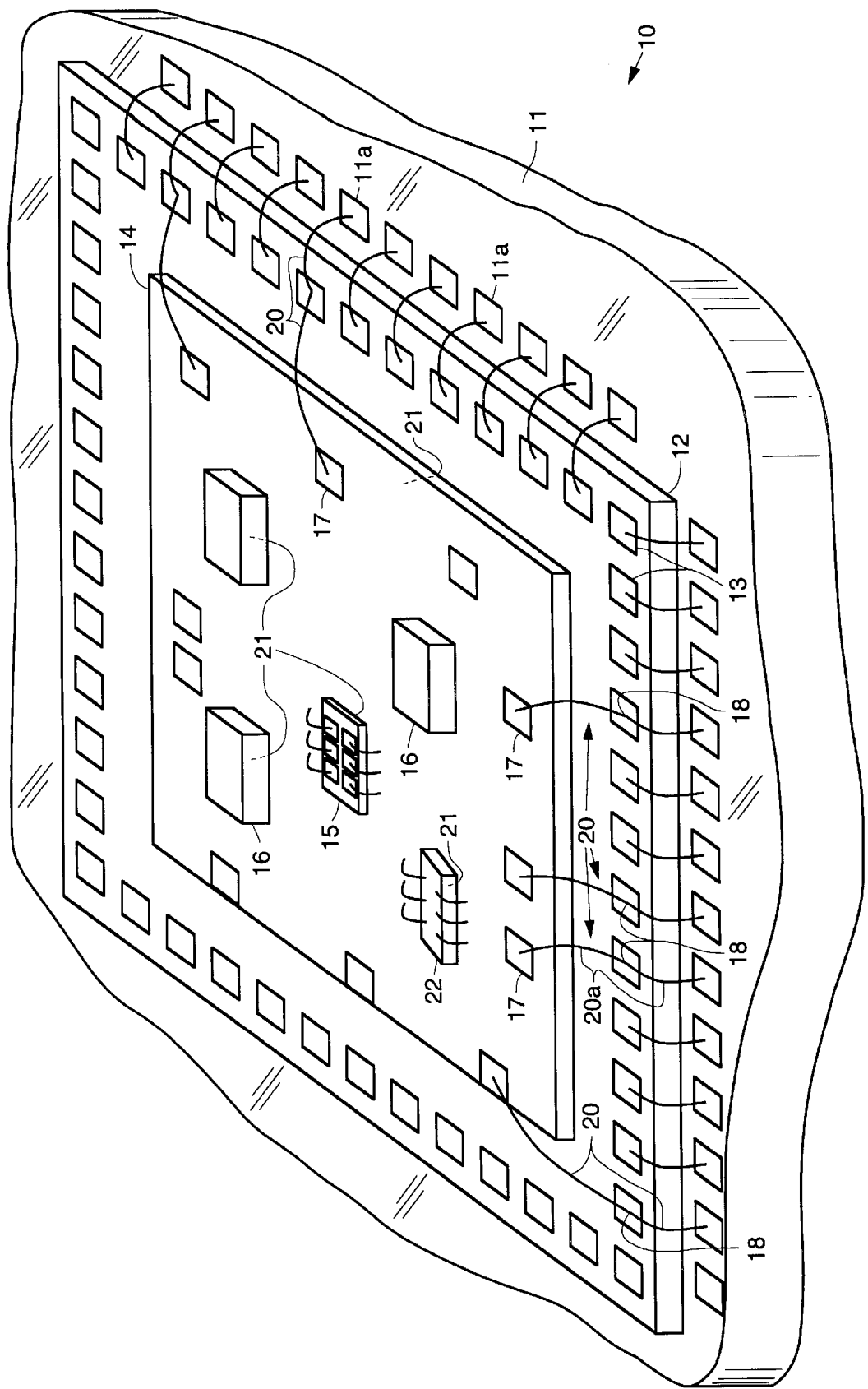

THREE-DIMENSIONAL COMPONENT STACKING USING HIGH DENSITY MULTICHIP INTERCONNECT DECALS AND THREE-BOND DAISY-CHAINED WEDGE BONDS

BACKGROUND

The present invention relates generally to interconnect structures, and more particularly, to three dimensional structures formed by stacking components using high density multichip interconnect decals.

Three-dimensional chip stacking is sometimes done when a user has full control over the design of a circuit and can make custom chips to permit inputs and outputs (I/Os) to line up where chip to chip connections must be made. Without the use of an interposer only nonconductive epoxy adhesive can be used to stack the chips. It is believed that three-dimensional mounting of passive devices on top of active devices has not been done in the past.

Accordingly, it is an objective of the present invention to provide for a three-dimensional circuit structure formed by stacking components using a high density multichip interconnect decal.

SUMMARY OF THE INVENTION

To meet the above and other objectives, the present invention provides for a three-dimensional circuit structure that interconnects an integrated circuit chip, along with additional active and passive components to a substrate by way of a high density multichip interconnect (HDMI) decal disposed on the integrated circuit chip. The three-dimensional circuit structure comprises a substrate, an integrated circuit attached to the top of the substrate, and a high density multichip interconnect decal 14 attached to the integrated circuit.

One or more passive components and relatively small active devices are attached to the top of the high density multichip interconnect decal. A plurality of three-bond, daisy-chained wedge bonds are used to interconnect the active devices and passive components to the substrate by way of the HDMI decal. Each wedge bond comprises a wire that initiates at an HDMI decal pad, an intermediate stitch bond at an integrated circuit pad, and terminates at a substrate pad.

The present invention permits commercial-off-the-shelf chips (active components) and passive components to be stacked on top of an integrated circuit using a high density multichip interconnect (HDMI) decal. The active and passive components are connected to the HDMI decal using either conductive epoxy (for back-biased devices) or nonconductive epoxy. The use of commercial-off-the-shelf chips produces a structure that has substantially lower cost than a structure formed using chips designed specifically for three-dimensional stacking.

The present invention permits stacking of passive components (and/or some active integrated circuit devices) onto larger integrated circuits by using high density multichip interconnect (HDMI) decals. The HDMI decal is attached to a top surface of an integrated circuit disposed on a substrate. Active and passive devices are then attached to the HDMI decal using epoxy adhesive (and wire bonded if applicable) instead of being attached to the substrate. The HDMI decal is interconnected to the underlying integrated circuit at the time that the integrated circuit is interconnected to the substrate.

This interconnection is performed by using a three-bond, daisy-chained wedge bond. The wedge bond initiates at a HDMI decal pad (a first bond), has an intermediate stitch bond at an integrated circuit pad (a second bond), and terminates at a substrate pad (a third bond). This daisy-chained wedge bond permits interconnection of the HDMI decal, integrated circuit, and substrate using one wire and using standard size wire bond pads on all components (instead of having larger pads to accommodate two bonds on one pad).

The HDMI decal serves as an interposer to mount passive and small active devices to, and routes the interconnections close to the appropriate wire bond pads of the underlying integrated circuit where they can be then interconnected to the underlying substrate. Standardized HDMI decals may be used that may be custom configured for specific applications. Custom configuration is done by wire bonding specific HDMI traces together with small stitch bonds to achieve the desired routing connections to the outer edges of the decal.

The present invention reduces the substrate area required to mount passive components by stacking them on top of larger, active integrated circuit devices. The present invention can save 25–75% of the normal planar surface area of the substrate, enabling substantial circuit miniaturization, or permitting more circuit functionality by the addition of more integrated circuits in the same amount of space. The present invention can also increase circuit performance by putting the passive and small active components in closer proximity to the large active integrated circuits.

BRIEF DESCRIPTION OF THE DRAWINGS

The various features and advantages of the present invention may be more readily understood with reference to the following detailed description taken in conjunction with the accompanying drawing figure which is a perspective view illustrating a three-dimensional circuit package in accordance with the principles of the present invention formed by stacking components using a high density multichip interconnect decal.

DETAILED DESCRIPTION

Referring to the sole drawing figure, it is a perspective view illustrating a three-dimensional circuit package 10 or structure 10 in accordance with the principles of the present invention. The three-dimensional circuit package 10 is comprised of a substrate 11 to which a using an integrated circuit 12 is attached. A high density multichip interconnect decal 14 is attached to a top surface of the integrated circuit 12 using an epoxy adhesive, for example.

The three-dimensional circuit package 10 is formed by stacking passive devices or components 15, 16 such as resistor networks 15 and decoupling capacitors 16, and the like, and small active devices 22 on top of the high density multichip interconnect decal 14 attached to the top of the integrated circuit 12. The present invention permits commercial-off-the-shelf active devices 22 or chips 22 to be stacked by means of the high density multichip interconnect (HDMI) decal 14 using either conductive epoxy 21 (for back-biased devices) or non-conductive epoxy 21, at substantially lower cost than commercial-off-the-shelf chips 22 designed specifically for three-dimensional stacking.

The present invention permits stacking of passive components 15, 16 (and/or some active integrated circuit devices 22) onto larger integrated circuits 12 by using high density multichip interconnect (HDMI) decals 14. The HDMI decal 14 is attached to the top surface of the integrated circuit 12 disposed on a substrate 11. Passive devices 15, 16 are then attached using epoxy adhesive 21 (and wire bonded if applicable) to the HDMI decal 14, instead of being directly attached to the substrate 11. The HDMI decal 14 is interconnected to the underlying integrated circuit 12 at the time that the integrated circuit 12 is interconnected to the substrate 11.

This interconnection technique is performed by using a three-bond, diasy-chained wedge bond 20. The wedge bond 20 initiates at an HDMI decal bond pad 17 (a first bond), has an intermediate stitch bond 18 at an integrated circuit bond pad 13 (a second bond), and terminates at a substrate bond pad 11a (a third bond). This daisy-chained wedge bond 20 permits interconnection of the HDMI decal 14, the integrated circuit 12, and the substrate 11 using a single wire 20a for each connection and using standard size wire bond pads 17, 13, 11a on all components (instead of requiring larger integrated circuit bond pads 13 on the integrated circuit 12 that accommodate two bonds on one pad).

The HDMI decal 14 serves as an interposer to mount the passive components 15, 16 and the small active devices 22 to the underlying integrated circuit 12, and to route the interconnections close to the appropriate integrated circuit wire bond pads 13 of the underlying integrated circuit 12 where they can be then interconnected to the underlying substrate 11. Standardized HDMI decals 14 may be used that are custom configured for specific applications. Custom configuring may be done by wire bonding specific HDMI traces together using small stitch bonds 18 to achieve the desired routing connections to the outer edges of the HDMI decal 14. The present invention thus increases circuit performance by locating the passive and small active components 15, 16, 22 in closer proximity to the large active integrated circuits 12.

The present invention thus permits three-dimensional component stacking for high density packaging applications. The present invention reduces the area on the substrate 11 required to mount passive components 15, 16 by stacking them on top of larger, active integrated circuits 12. The present invention can save 25–75% of the normal planar surface area of the substrate 11, enabling substantial circuit miniaturization, or can provide additional circuit functionality by allowing additional integrated circuits 12 in the same amount of space on the substrate 11. When using HDMI substrates 11, for example, this translates into a savings of $250–$750 per multichip module (compared to a two-dimensional, 2 inch by 4 inch multichip module). For an application requiring 1000 2 inch by 4 inch multichip modules which might normally be designed using conventional two-dimensional packaging, this translates into a $2.5–7.5 million savings using the present three-dimensional packaging technique.

Thus, a three-dimensional circuit package or structure formed by stacking components using a high density multichip interconnect decal has been disclosed. It is to be understood that the described embodiments are merely illustrative of some of the many specific embodiments which represent applications of the principles of the present invention. Clearly, numerous and other arrangements can be readily devised by those skilled in the art without departing from the scope of the invention.

What is claimed is:

1. A three-dimensional circuit structure comprising:

a substrate;

an integrated circuit attached to the top of the substrate;

a high density multichip interconnect decal attached to the integrated circuit;

a passive component attached to the top of the high density multichip interconnect decal;

an active device attached to the top of the high density multichip interconnect decal; and a plurality of three-bond, daisy-chained wedge bonds that each comprise a wire that initiates at an HDMI decal bond pad, an intermediate stitch bond at an integrated circuit bond pad, and terminates at a substrate bond pad.

2. The interconnect structure of claim 1 wherein the high density multichip interconnect decal is attached to a top surface of the integrated circuit using epoxy adhesive.

3. The interconnect structure of claim 1 wherein the passive component comprises a resistor network.

4. The interconnect structure of claim 1 wherein the passive component comprises a decoupling capacitor.

5. The interconnect structure of claim 1 wherein the active device comprises a commercial-off-the-shelf integrated circuit chip.

6. The interconnect structure of claim 1 wherein the active device is attached to the top of the high density multichip interconnect decal using conductive epoxy.

7. The interconnect structure of claim 1 wherein the active device is attached to the top of the high density multichip interconnect decal using non-conductive epoxy.

8. The interconnect structure of claim 1 wherein the wedge bonds each comprise a single wire.

9. The interconnect structure of claim 1 wherein the HDMI decal, the integrated circuit, and the substrate comprise substantially identical size wire bond pads.

* * * * *